(12) United States Patent
Pagani et al.

(10) Patent No.: US 9,318,313 B2
(45) Date of Patent: Apr. 19, 2016

(54) SEMICONDUCTOR STRUCTURE WITH LOW-MELTING-TEMPERATURE CONDUCTIVE REGIONS, AND METHOD OF REPAIRING A SEMICONDUCTOR STRUCTURE

(71) Applicant: STMicroelectronics S.r.l., Agrate Brianza (IT)

(72) Inventors: Alberto Pagani, Nova Milanese (IT); Federico Giovanni Ziglioli, Pozzo D'adda (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 242 days.

(21) Appl. No.: 13/869,124

(22) Filed: Apr. 24, 2013

(65) Prior Publication Data

US 2013/0285056 A1  Oct. 31, 2013

(30) Foreign Application Priority Data

Apr. 27, 2012 (IT) .............................. TO2012A0374

(51) Int. Cl.
*H01L 29/40* (2006.01)
*H01L 21/00* (2006.01)
(Continued)

(52) U.S. Cl.
CPC ................ *H01L 21/02* (2013.01); *H01L 22/14* (2013.01); *H01L 23/544* (2013.01); *H01L 24/03* (2013.01);
(Continued)

(58) Field of Classification Search
CPC ......... H01L 22/14; H01L 22/20; H01L 22/30; H01L 24/03; H01L 24/04; H01L 24/05; H01L 24/16; H01L 24/48; H01L 24/94; H01L 24/98; H01L 25/0657; H01L 21/02; H01L 21/4814; H01L 21/4825; H01L 23/544; H01L 23/488; H01L 23/49513; H01L 24/00; H01L 24/13; H01L 24/45; H01L 2225/06513; H01L 2224/05681; H01L 2224/13025; H01L 2224/131; H01L 2224/45099; H01L 2224/48453; H01L 2224/48463; H01L 2224/81203; H01L 2224/81205; H01L 2224/81815; H01L 2224/85375; H01L 2224/94; H01L 2224/05006; H01L 2224/81; H01L 2924/1461; H01L 2924/143; H01L 2924/141; H01L 2924/0132; H01L 2924/01079; H01L 2924/0103; H01L 2924/0105; H01L 2924/01322; H01L 2924/01047; H01L 2924/01029; H01L 2924/05442; H01L 2924/00014
USPC ........ 257/48, 499, 621, 685; 438/15, 17, 107; 228/119, 227, 264
See application file for complete search history.

(56) References Cited

U.S. PATENT DOCUMENTS 4,998,665 A * 3/1991 Hayashi ..................... 228/180.1
5,391,516 A  2/1995 Wojnarowski et al.
(Continued)

FOREIGN PATENT DOCUMENTS

EP  1091408  4/2001
EP  1096575  5/2001
(Continued)

OTHER PUBLICATIONS

International Search Report for Italian patent application No. TO20120374; Munich, Germany, Feb. 15, 2013, 2 pages.

*Primary Examiner* — Nikolay Yushin
(74) *Attorney, Agent, or Firm* — Gardere Wynne Sewell LLP

(57) ABSTRACT

A semiconductor structure includes at least a semiconductor body, a delimiting structure delimiting a cup-shaped recess in the body and a conductive region in the recess. The conductive region is made of a low-melting-temperature material, having a melting temperature lower than that of the materials forming the delimiting structure.

25 Claims, 10 Drawing Sheets

(51) Int. Cl.
*H01L 21/02* (2006.01)
*H01L 21/66* (2006.01)
*H01L 23/00* (2006.01)
*H01L 25/065* (2006.01)
*H01L 23/544* (2006.01)

(52) U.S. Cl.
CPC ............... *H01L 24/05* (2013.01); *H01L 24/16* (2013.01); *H01L 24/48* (2013.01); *H01L 24/94* (2013.01); *H01L 24/98* (2013.01); *H01L 25/0657* (2013.01); *H01L 24/13* (2013.01); *H01L 24/45* (2013.01); *H01L 2224/022* (2013.01); *H01L 2224/0215* (2013.01); *H01L 2224/02145* (2013.01); *H01L 2224/02185* (2013.01); *H01L 2224/02215* (2013.01); *H01L 2224/037* (2013.01); *H01L 2224/03849* (2013.01); *H01L 2224/0401* (2013.01); *H01L 2224/04042* (2013.01); *H01L 2224/04073* (2013.01); *H01L 2224/05006* (2013.01); *H01L 2224/05082* (2013.01); *H01L 2224/05124* (2013.01); *H01L 2224/05144* (2013.01); *H01L 2224/05147* (2013.01); *H01L 2224/05155* (2013.01); *H01L 2224/05164* (2013.01); *H01L 2224/05169* (2013.01); *H01L 2224/05601* (2013.01); *H01L 2224/05609* (2013.01); *H01L 2224/05611* (2013.01); *H01L 2224/05618* (2013.01); *H01L 2224/05644* (2013.01); *H01L 2224/05681* (2013.01); *H01L 2224/131* (2013.01); *H01L 2224/13025* (2013.01); *H01L 2224/16147* (2013.01); *H01L 2224/45099* (2013.01); *H01L 2224/48453* (2013.01); *H01L 2224/48463* (2013.01); *H01L 2224/81203* (2013.01); *H01L 2224/81205* (2013.01); *H01L 2224/81375* (2013.01); *H01L 2224/81815* (2013.01); *H01L 2224/81895* (2013.01); *H01L 2224/85375* (2013.01); *H01L 2224/85805* (2013.01); *H01L 2224/94* (2013.01); *H01L 2225/06513* (2013.01); *H01L 2924/0132* (2013.01); *H01L 2924/01322* (2013.01); *H01L 2924/141* (2013.01); *H01L 2924/143* (2013.01); *H01L 2924/1461* (2013.01)

(56) References Cited

U.S. PATENT DOCUMENTS

| | | | |
|---|---|---|---|
| 6,222,280 B1 * | 4/2001 | Farnworth et al. | 257/780 |
| 6,285,203 B1 * | 9/2001 | Akram et al. | 324/750.25 |
| 6,329,722 B1 | 12/2001 | Shih et al. | |
| 6,844,631 B2 | 1/2005 | Yong et al. | |
| 7,964,964 B2 * | 6/2011 | Sheats | 257/737 |
| 2004/0052113 A1 | 3/2004 | Diorio et al. | |
| 2004/0061168 A1 | 4/2004 | Cappelletti et al. | |
| 2005/0030826 A1 | 2/2005 | Diorio et al. | |
| 2005/0030827 A1 | 2/2005 | Gilliland et al. | |
| 2005/0098605 A1 | 5/2005 | Edelstein et al. | |
| 2011/0076800 A1 * | 3/2011 | Hirai et al. | 438/107 |
| 2011/0157972 A1 | 6/2011 | Pasotti et al. | |
| 2011/0157977 A1 | 6/2011 | Pasotti et al. | |
| 2011/0278568 A1 * | 11/2011 | Pagani | 257/48 |

FOREIGN PATENT DOCUMENTS

| | | |
|---|---|---|
| JP | 60035552 | 2/1985 |
| WO | 0057472 | 9/2000 |

* cited by examiner

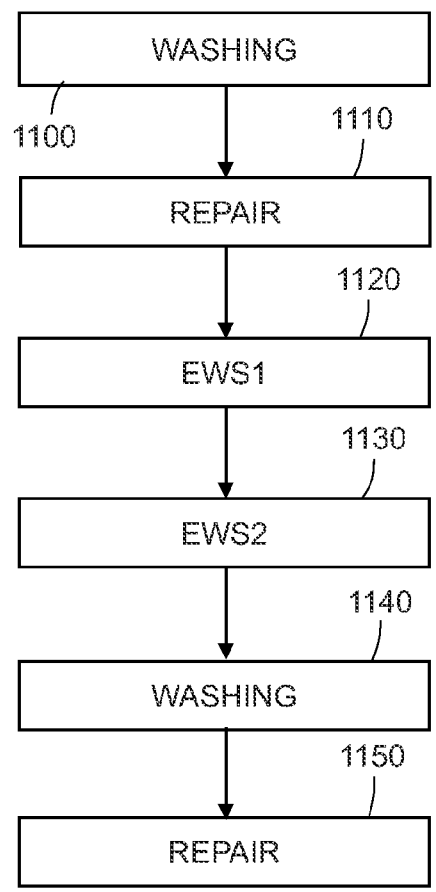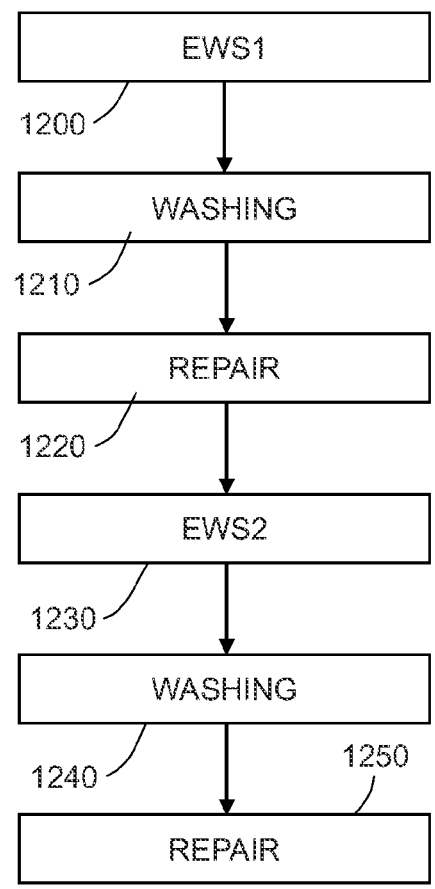
Fig.11  Fig.12
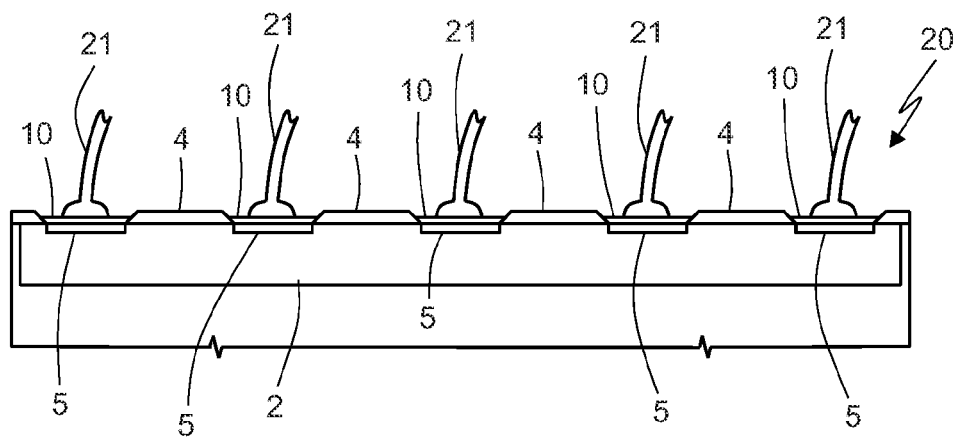
Fig.13

SEMICONDUCTOR STRUCTURE WITH LOW-MELTING-TEMPERATURE CONDUCTIVE REGIONS, AND METHOD OF REPAIRING A SEMICONDUCTOR STRUCTURE

PRIORITY CLAIM

The instant application claims priority to Italian Patent Application No. TO2012A000374, filed on Apr. 27, 2012, which application is incorporated herein by reference in its entirety.

TECHNICAL FIELD

An embodiment relates to a semiconductor structure with low-melting-temperature conductive regions, and to a method of repairing a semiconductor structure.

BACKGROUND

As is known, the production of integrated devices envisages testing steps that allow to check proper operation of the components obtained. Tests of this kind, such as, for example, EWS (Electrical Wafer Sorting) or WS (Wafer Sorting), are normally performed at the level of semiconductor wafer, by coupling ATE (Automatic Test Equipment) to contact pads of the DUTs (Devices Under Test) present on the wafer itself. The pads can be specifically dedicated to the tests, but more frequently a portion of the entire set of the pads of the devices that will subsequently have to serve for the coupling of the devices to enable their use in the final application are also employed for testing.

For coupling the testing machine to the wafer under test, interface cards or "probe-cards" are generally used, that normally include a PCB (Printed Circuit Board) provided with probe-electrodes, which is placed in contact with the pads with a given pressure to ensure electrical coupling in all cases.

After the electrical testing steps, the wafers, whether single or composite, are cut into dice or chips and assembled in packaging structures. Then, the pads are electrically coupled to pins of the packaging structures for coupling with external devices. Electrical coupling is frequently obtained using a wire-bonding technique, with which wire couplings between the pads and the pins are provided, or else bumps can be used.

The same pads must hence serve both for testing and for electrical coupling to the outside world.

The mechanical action of the probe-electrodes causes, however, surface damage to the pads, which can deteriorate the quality of the electrical couplings obtainable during assembly up to the point of rendering the pads themselves unusable. Amongst other things, in various cases a single testing sequence is not sufficient, and various machines are used to execute different test sequences. This may entail positioning the interface card or cards a number of times, thus increasing the risk of damage to the pads.

To overcome this drawback, various solutions have been proposed, none of which is, however, altogether satisfactory.

For example, in U.S. Pat. No. 6,844,631, which is incorporated by reference, it has been proposed to provide auxiliary metallizations, which extend not only on the pads but also on part of the passivation layer surrounding the pads. In this way, a part of the auxiliary metallization (for example, on the passivation layer) can be dedicated exclusively to contacting in the testing step. The remaining part of the auxiliary metallization, which does not come into contact with the probe-electrodes, is not damaged, and can be used to obtain a high-quality electrical coupling via wire-bonding or some other technique. Alternatively, the auxiliary metallization can be removed chemically after the testing step, leaving the pads free and without damage.

If the quality of the contacts can in this way be preserved, it has, however, been noted that the regions underlying the metallizations around the pads are subject to failure, especially when metal lines made of copper are present, which may be exposed to the oxidizing action of air. Moreover, the area provided for each pad typically is increased to enable the production of the auxiliary metallizations. The density of the pads is hence disadvantageously reduced.

Other variants make up in part for the limits of the solution described, but entail numerous additional processing steps, which are rather complex and lead to a significant increase in the unit cost of production of the devices.

According to a different solution described in U.S. Pat. No. 5,391,516, which is incorporated by reference, the contact pads are repaired after the testing step using a laser beam that heats the pads themselves beyond the melting temperature (e.g., for aluminium 660° C.). Leaving aside the evident effects of a possible poor alignment of the laser beam, the extremely marked thermal gradient produced by concentrated heating can easily cause failure owing to non-uniform thermal expansion.

SUMMARY

An embodiment is a semiconductor structure, and a method of repairing a semiconductor structure, that are free from the limitations described.

BRIEF DESCRIPTION OF THE DRAWINGS

For a better understanding of the subject matter disclosed herein, one or more embodiments thereof will now be described, purely by way of non-limiting example and with reference to the attached drawings, wherein:

FIG. 11 is a simplified block diagram regarding a method in accordance with a different embodiment of the present invention;

FIG. 12 is a simplified block diagram regarding a method in accordance with a further embodiment;

FIG. 13 is a cross section through a device obtained by cutting the semiconductor structure of FIG. 1, according to an embodiment;

DETAILED DESCRIPTION

Figure 1:
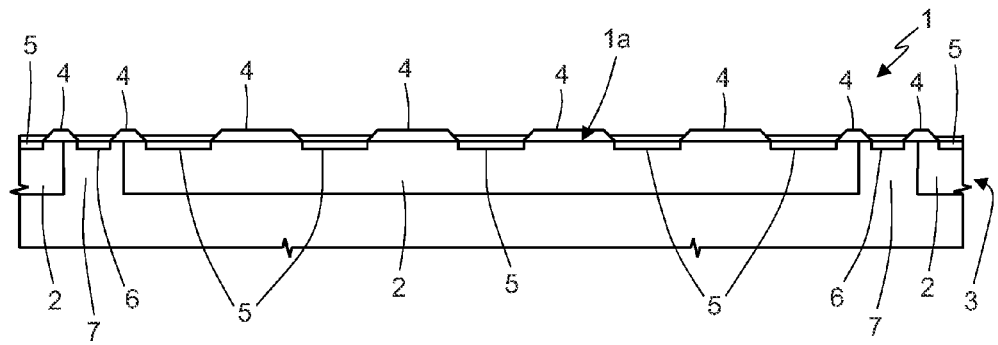
FIG. 1 is a cross section through a semiconductor structure in accordance with an embodiment.

Shown in FIG. 1 is a portion of a semiconductor wafer 1, having a main surface 1a (i.e., a face of larger area) and incorporating a plurality of integrated devices 2. The integrated devices 2 may be of any type that can be obtained with processing techniques used in the microelectronics sector and, in particular, may be integrated circuits of any kind (analog, digital, high-voltage, or low-voltage ones), microelectromechanical devices (sensors, transducers, actuators), or combinations of circuit components and microelectromechanical structures.

The portion of the wafer 1 housing the integrated devices 2 will be referred to in what follows as structural portion 3 and includes a plurality of layers and structures made of semiconductor material, in which layers and structures made of dielectric and metal materials may be incorporated, according to what is required to obtain the integrated devices 2. The structural portion 3 of the wafer 1 is covered with a passivation layer 4 of dielectric material.

The integrated devices 2 are provided with respective contact pads 5 for coupling to the outside via conventional techniques, such as, for example, a wire-bonding technique or a bump technique. Furthermore, on the wafer 1 further contact pads 6 may be provided, coupled to respective integrated devices or TEGs (Test Element Groups—not illustrated) and specifically dedicated to execution of particular electrical tests of a mainly parametric type, in general to evaluate the parameters of the process of production of the wafer 1. In one embodiment, the pads 6 are provided on scribe lines 7 of the wafer 1, since they can be sacrificed once the required tests have been performed. The couplings of the pads 5, 6 to the respective integrated devices are made in a way in itself known and are not illustrated for reasons of simplicity.

The passivation layer 4 has pad openings to enable access to the pads 5, 6.

Figure 2:
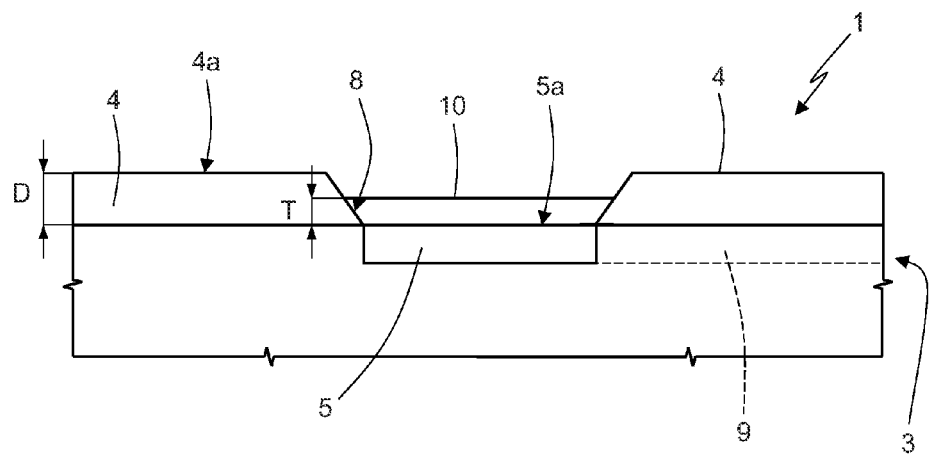
FIG. 2 shows an enlarged detail of the semiconductor structure of FIG. 1, according to an embodiment.

One of the pads 5 is illustrated in greater detail in FIG. 2. The pad 5 is located at one end of an electrical-coupling line 9, which, in one embodiment, is made by a "damascene" technique on the surface of the structural portion 3 of the wafer 1.

The pad 5 is made of metal, for example aluminium, copper, gold, platinum, nickel or palladium, or else may include a multilayer of two or more distinct metals, for example taken from among those listed above or other conductive materials.

The pad 5 is depressed with respect to a surface 4a of the passivation layer 4 opposite to the structural portion 3. The passivation layer 4 and the pad 5 form a delimiting structure defining a cup-shaped recess 8 in the wafer 1. More precisely, the recess 8 is delimited laterally by the passivation layer 4 and on the bottom by a surface 5a of the pad 5.

A protecting layer 10 made of low-melting-temperature conductive material covers the pad 5 in the recess 8. Moreover, the protecting layer 10 has a thickness T lower than the depth D of the recess 8, which is defined by the distance between the surface 5a of the pad 5 in contact with the protecting layer 10 and the surface 4a of the passivation layer 4. Consequently, the protecting layer 10 is entirely contained in the recess 8.

The material that forms the protecting layer 10 has a melting temperature lower than the material that forms the delimiting structure (i.e., the passivation layer 4 and the pads 5, 6) and the electrical-coupling lines 9. For example, the melting temperature of the material forming the protecting layer can be lower than approximately 400° C., for example, lower than approximately 300° C. In an embodiment, the melting temperature of the material forming the protecting layer 10 is lower than the maximum temperature to which the wafer 1 is heated during the testing steps. The protecting layer 10 may be made, for example, of a soldering alloy (of the type used for soldering components on PCBs) or of a eutectic alloy, for example, but not limited thereto, chosen from:

tantalum—gold, with approximately 28% of gold (melting temperature of approximately 131° C.);

tin—zinc, with approximately 9% of zinc (melting temperature of approximately 199° C.);

tin—gold, with approximately 10% of gold (melting temperature of approximately 217° C.);

gold—tin, with approximately 20% of tin (melting temperature of approximately 280° C.);

zinc—tin, with 5% of tin (melting temperature of approximately 382° C.).

Alternatively, also non-eutectic alloys can be used, such as, for example, but not limited thereto:

tin—silver, with approximately 4% of silver (melting temperature in a range approximately between 221° C. and 229° C.);

tin—copper, with approximately 0.7% of copper (melting temperature of approximately 227° C.);

zinc—tin, with approximately 30% of tin (melting temperature in a range approximately between 199° C. and 376° C.).

Of course, the percentages of the compositions of the various materials may be modified to change, for example, the melting temperature or their mechanical and/or electrical properties. For example, compositions may be used, where the percentages of the materials vary up to approximately 30%, for example, up to approximately 20% with respect to their eutectic composition, even though for specific requirements there is not excluded the possibility of having greater variations.

Once again alternatively, metals not in alloy can be used, such as:

tin (melting temperature of approximately 232° C.);

indium (melting temperature approximately 156° C.).

The protecting layer 10 may be made using known processes, such as, for example, processes of an electrolytic or electroless type.

Figure 3:
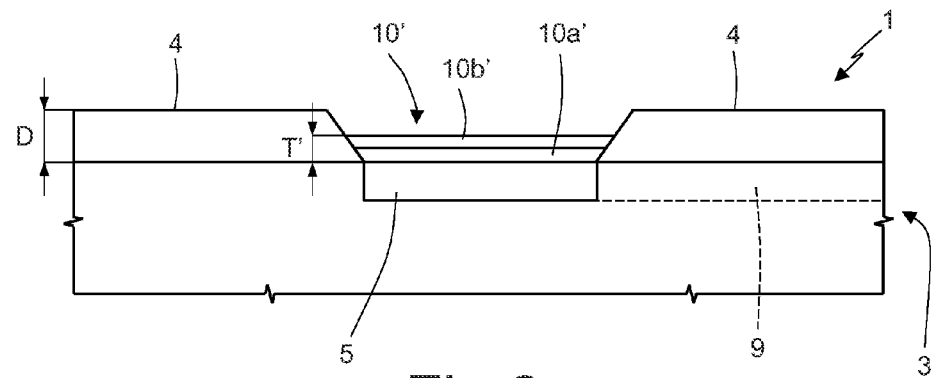
FIG. 3 is a cross section through a portion of a semiconductor structure in accordance with a different embodiment.

In an embodiment (FIG. 3), a protecting structure 10' includes a stack of layers, here a first layer 10a' and a second layer 10b'. The first layer 10a' or inner layer is in contact with the pad 5, while the second layer 10b' or outer layer has an exposed surface. The overall thickness T' of the protecting structure 10' is in any case lower than the distance D between the surface 5a of the pad 5 and the surface 4a of the passivation layer 4.

At least the outer layer 10b' is made of a low-melting-temperature material, i.e., with a melting temperature lower than that of the materials that form the delimiting structure (passivation layer 4 and pads 5, 6). In particular, the material forming the outer layer 10b' melts at lower temperatures than the pads 5, 6. For example, any one of the materials listed above may be used.

Figure 4:
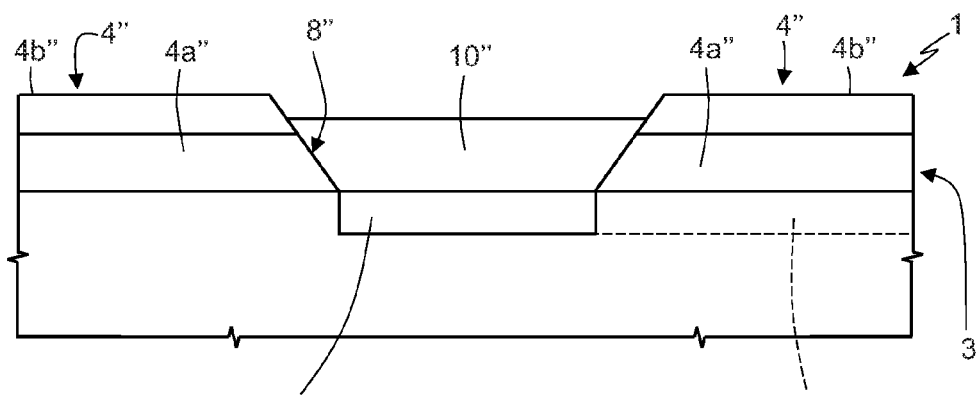
FIG. 4 is a cross section through a portion of a semiconductor structure in accordance with a further embodiment.

In an embodiment (FIG. 4), a passivation structure 4" having openings over the pads 5 includes a plurality (two in the example illustrated) of passivation layers 4a", 4b". The passivation structure 4" and the pads 5 form a delimiting structure defining in the structural portion 3 of the wafer 1 cup-shaped recesses 8" delimited laterally by the passivation structure 4" and on the bottom by respective pads 5. Within the recesses 8", each pad 5 is covered with a respective protecting layer 10" of low-melting-temperature material, which may be rather thick thanks to the presence of multiple passivation layers 4a", 4b".

Figure 5:
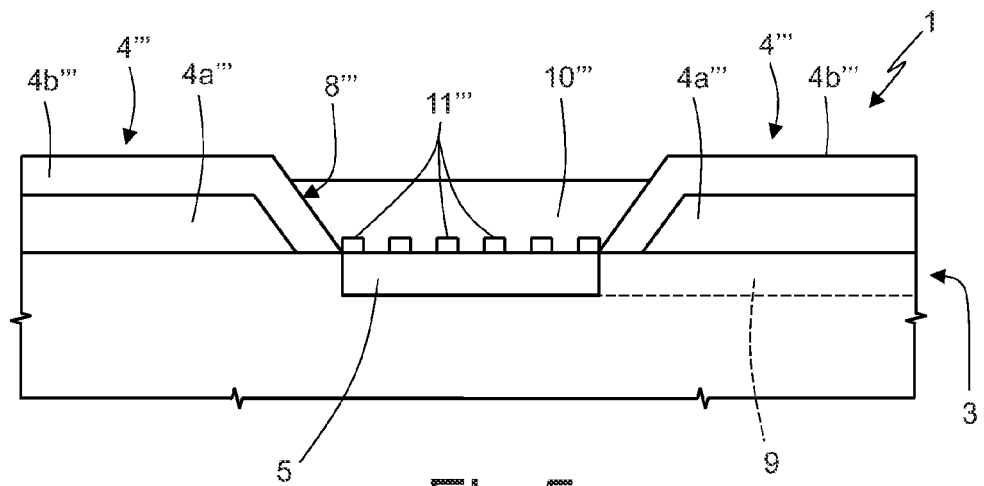
FIG. 5 is a cross section through a portion of a semiconductor structure in accordance with a further embodiment.

In an embodiment (FIG. 5), a dielectric structure 4''' having openings on the pads 5 includes a dielectric layer 4a''' for example made of TEOS oxide, covered with a passivation layer 4b'''. The dielectric structure 4''' and the pads 5 form a delimiting structure defining in the structural portion 3 of the wafer 1 cup-shaped recesses 8''' delimited laterally by the passivation structure 4''' and on the bottom by respective pads 5.

Moreover, the pads 5 are covered with a protecting grid 11''' made of insulating or dielectric material, for example silicon oxide.

Also in this case, it is possible to form in each recess 8''' a rather thick protecting layer 10''' of low-melting-temperature material, which penetrates through the protecting grid 11''' and is in contact with the respective pad 5. In particular, the material forming the protecting layer 10''' has a melting temperature lower than that of the materials that form the delimiting structure (passivation layer 4''' and, in particular, pads 5, 6). For example, any one of the materials listed above may be used.

Figure 6:
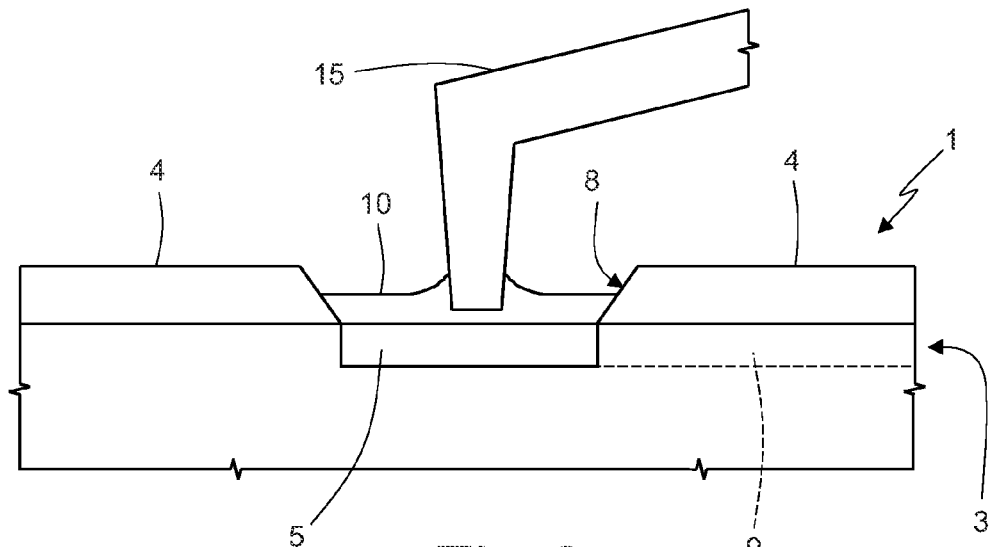
FIG. 6 shows the detail of FIG. 2 during an electrical-testing step, according to an embodiment.

When an electrical test is performed on the devices 2 integrated in the wafer 1 (for example, an EWS test), probe-electrodes 15 are electrically coupled to respective pads 5, 6, as illustrated in FIG. 6 (FIG. 6 refers to the embodiment of FIGS. 1 and 2, but what is described applies indifferently also to all other embodiments).

In detail, the probe-electrodes 15 (here of the cantilever type) are placed mechanically in contact with the protecting layers 10 of the respective pads 5, 6 necessary for the test with a pressure sufficient to prevent loss of coupling. Since the protecting layers 10 are made of conductive material, the probe-electrodes 15 are electrically coupled to the respective pads 5, 6.

As a result of the pressure, the surface of the protecting layers 10 is marked, and the ends of the probe-electrodes 15 sink in part into the protecting layers 10, damaging them and leaving a probe mark.

Figure 7:
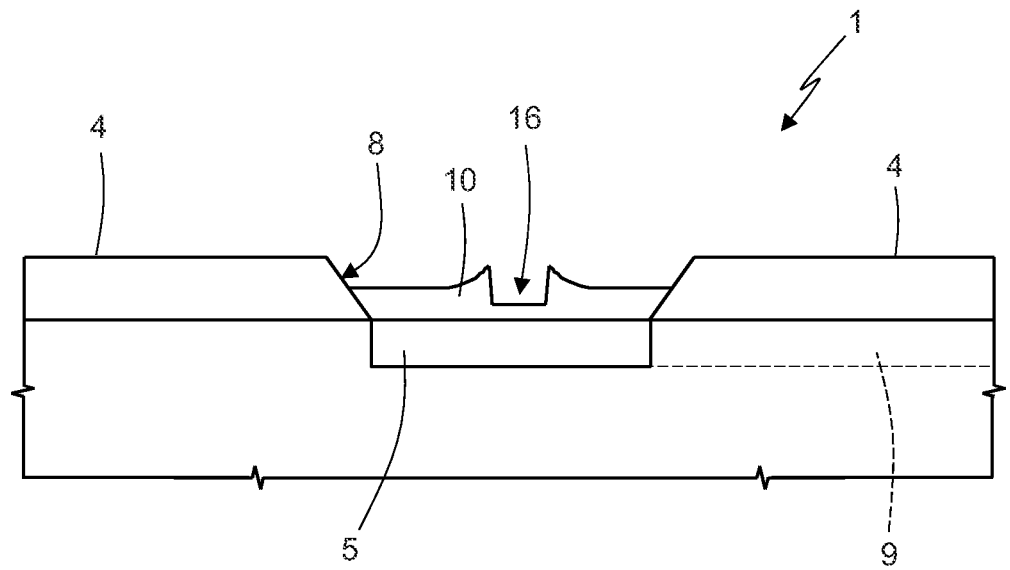
FIG. 7 shows the detail of FIG. 2 at the end of the electrical test, according to an embodiment.
Figure 8:
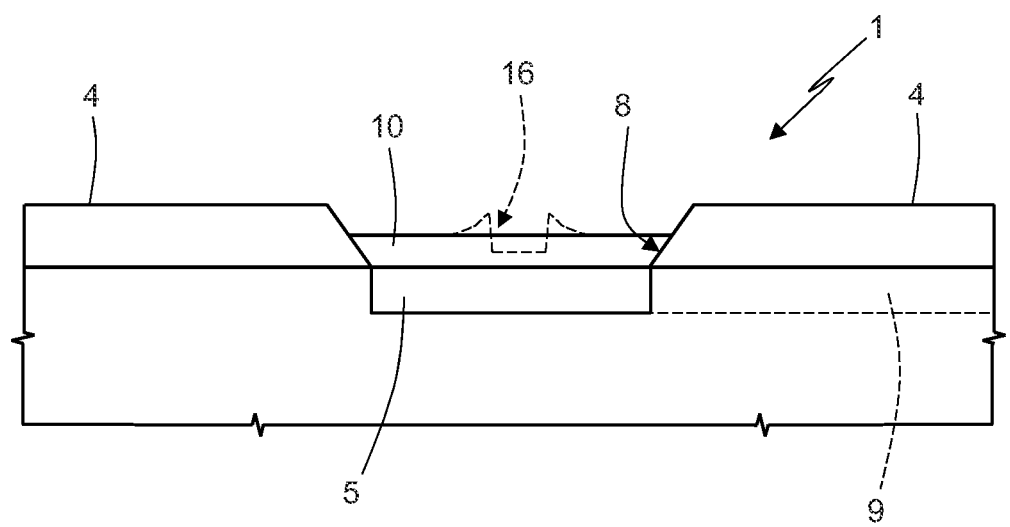
FIG. 8 shows the detail of FIG. 2 during execution of a method of repairing semiconductor structures, according to an embodiment.

Once the testing step is through, the protecting layers 10 of the pads 5, 6 can be repaired by means of a thermal process. When the probe-electrodes 15 are removed, the protecting layers 10 present probe marks 16 (FIG. 7). The wafer 1 is heated to a temperature higher than the melting temperature of the material forming the protecting layers 10 (and lower than the melting temperature of the material or materials of which the delimiting structure is made, in particular the pads 5, 6). During the heating step, the wafer 1 is kept approximately in the horizontal position (more precisely with the main surface 1a approximately horizontal) to enable the molten material to spread uniformly, repairing the probe marks 16 and restoring the surface integrity of the protecting layers 10, as illustrated in FIG. 8. Thanks to the fact that the protecting layers 10 are entirely contained in the recesses 8 defined laterally by the passivation layer 4, which functions as delimiting structure, and on the bottom by the respective pads 5, 6, it is sufficient for the wafer 1 to remain approximately horizontal to prevent the molten material from being dispersed.

The wafer 1 is then left to cool, still in approximately the horizontal position, until the protecting layers 10 solidify.

Figure 9:
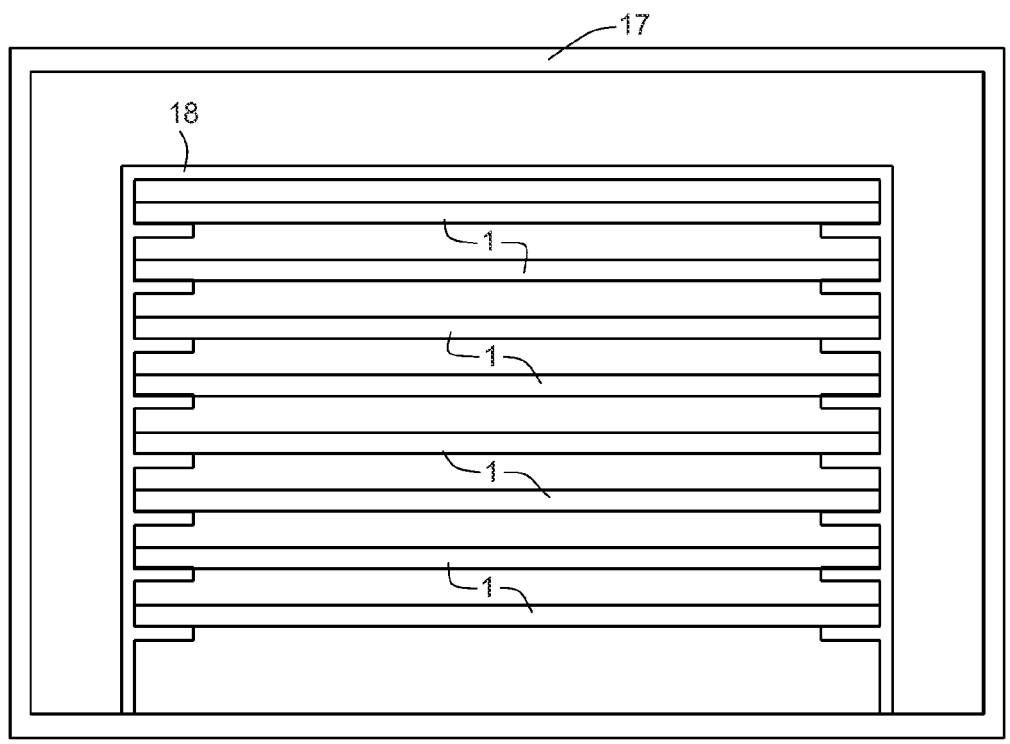
FIG. 9 shows a step of a method according to an embodiment.

In an embodiment, heating of the wafer 1 is performed in an oven 17, as illustrated in FIG. 9. In this case, a plurality of wafers 1 are loaded in so-called "wafer carriers" 18 that enable the proper horizontal arrangement to be maintained. The wafer carriers 18 are introduced into the oven for a time sufficient for melting the material forming the protecting layers 10.

During the entire testing procedure, the pads 5 remain protected, do not undergo phenomena of oxidation, and do not undergo damage. Moreover, any possible damage to the protecting layers 10 can be easily repaired as described with a consequent improvement of the quality and of the production yield.

Figure 10:
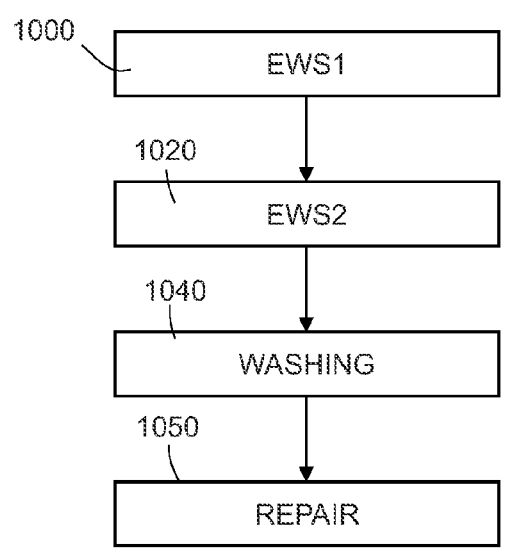
FIG. 10 is a simplified block diagram regarding a method in accordance with an embodiment.

The thermal process of repair of the surface of the protecting layers 10 of the pads 5, 6 (block 1050 in FIG. 10) that follows electrical testing steps (blocks 1000, 1020) may be preceded by a washing step (block 1040) for removal of possible contaminating particles and substances.

In addition to being performed at the end of testing of the integrated devices 2 (blocks 1120, 1130 in FIG. 11), the washing process (blocks 1100, 1140) and the repair thermal process (blocks 1110, 1150) may be performed before starting, in order to eliminate possible defects of production and contamination present on the surface of the protecting layers 10. Moreover, if a number of testing sequences (blocks 1200, 1230—FIG. 12) are envisaged, the washing process (blocks 1210, 1240) and the thermal process of repair (blocks 1220, 1250) may be repeated after each testing sequence.

If the testing process causes a reduction of thickness of the protecting layers 10, it is possible to reintegrate the missing material.

Once the electrical test and the thermal process is finished, the wafer 1 is cut into dice 20, each of which contains an integrated device 2 with the respective pads 5, as illustrated in FIG. 13. The pads 6 provided in the scribe lines and dedicated exclusively to the parametric electrical test can be sacrificed. At this point, the protecting layers 10 offer a surface that is substantially without imperfections and may be used to provide couplings 21 of the device, for example by the wire-bonding or bumping technique.

Figure 14:
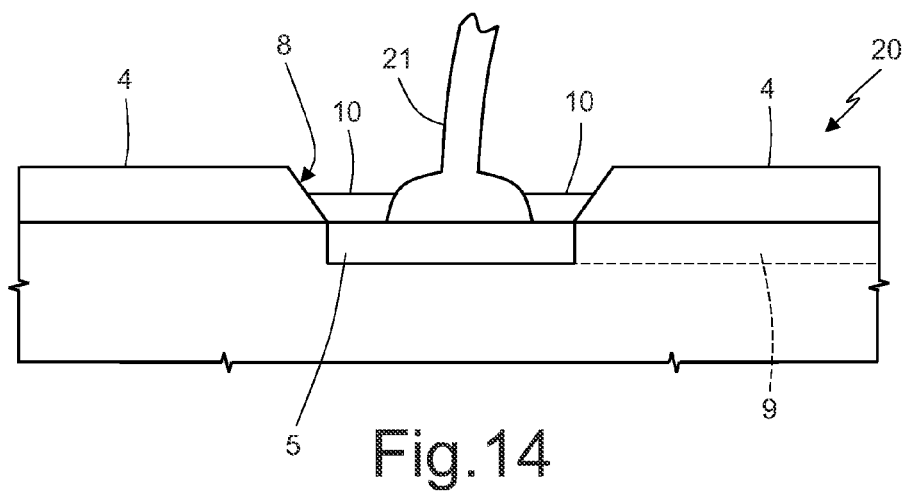
FIG. 14 shows a variant of an enlarged detail of the device of FIG. 10, according to an embodiment.
Figure 15:
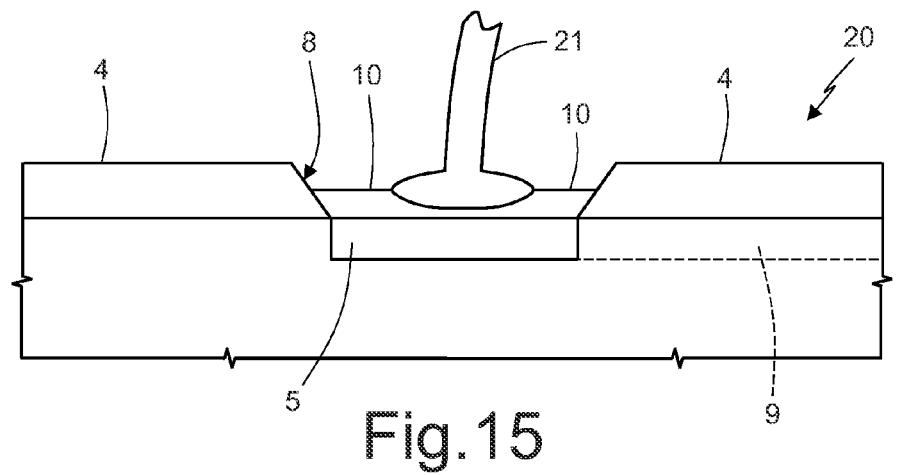
FIG. 15 shows a further variant of an enlarged detail of the device of FIG. 10, according to an embodiment.

Since the wire-bonding technique envisages heating the material forming the couplings 21, the protecting layers 10 may be melted once again and the couplings may sink even to the point of reaching the pads 5 (FIG. 14) or else penetrate just partially into the protecting layers 10 (FIG. 15).

In an embodiment (not illustrated), the protecting layers 10 may be removed after completion of the electrical-testing procedure. In this case, the electrical couplings can be provided directly on the pads 5.

In an embodiment (not illustrated), the protecting layers 10 may be coupled to bumps after completion of the electrical-testing procedure. These bumps may be made of a material similar to the material of the protecting layers 10.

In a further embodiment, the material forming the protecting layers 10 has a melting temperature lower than the maximum temperature to which the wafer 1 is brought during the testing step, which may involve conditions of thermal stress, such as the EWS process or the WLBI (Wafer Level Burn-In) process, where an electrical test is performed at high temperature. In this case, the protecting layers 10 melt already during the test, and it is sufficient to separate the probe-electrodes 15 from the wafer 1 before solidification occurs. In practice, the step of thermally repairing the protecting layers 10 of the pads 5, 6 is at least in part performed during the electrical-testing procedure at high temperature. The protecting layers 10 in this case do not present probe marks. During the electrical-testing step at high temperature, the probe-electrodes 15 come into contact with the pads 5, 6 and penetrate at least partially into the protecting layers 10. The molten material surrounds the ends of the probe-electrodes 15, improving also the contact resistance. The surface of contact between the probe-electrodes 15 and the pads 5, 6 in fact increases, thanks to the material of the protecting layers 10 that envelops the ends of the probe-electrodes 15. Moreover, the reduction of the contact resistance increases the maximum current limit that the end of the probe can withstand, improving the electrical efficiency.

Similar advantages may be present even when the material forming the protecting layers 10 has a melting temperature higher than the temperature to which the wafer 1 is brought during the testing step, but the local heating due to the passage of current through the ends of the probe-electrodes 15 is sufficient to cause melting of the protecting layers 10.

Figure 16:
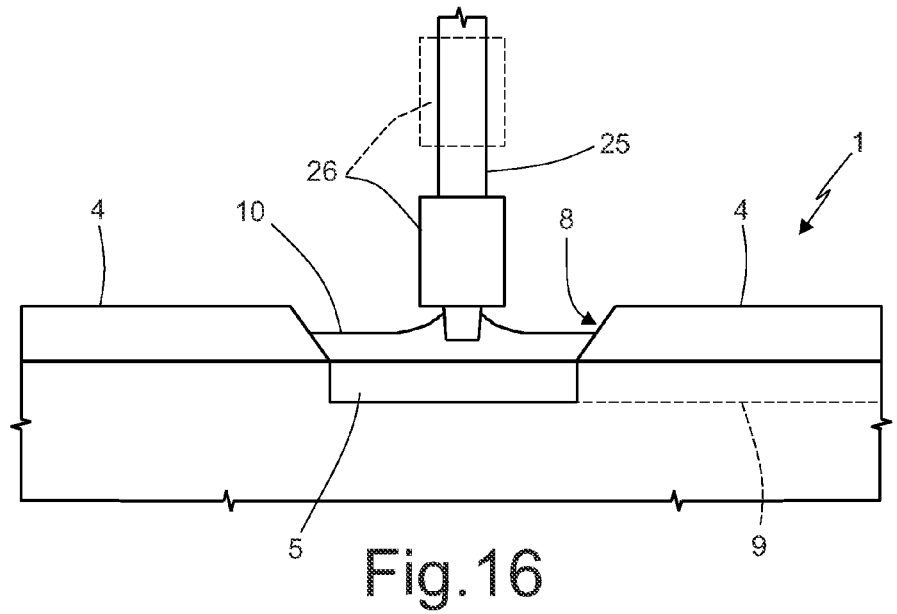
FIG. 16 shows a step of a method of repairing semiconductor structures according to a different embodiment.

Melting of the protecting layers 10 may be reached also using probe-electrodes 25 provided with heating elements 26 (see in this connection FIG. 16). The heating elements 26 may, for example, be heating resistors of an annular shape fitted on respective probe-electrodes 25.

The probe-electrodes 25 are coupled to respective pads 5, 6, and the electrical tests are performed as usual. Once the testing operations are through, the heating elements 26 are activated for melting the protecting layers 10 of the pads 5, 6. The probe-electrodes 25 are then retracted, and the protecting layers 10 are left to solidify in approximately the horizontal position.

The heating elements 26 may be able to slide between a resting position and a working position, where they are in the proximity or in contact with the protecting layers 10 of the pads 5, 6, so as to render thermal coupling and transfer of energy efficiently.

Alternatively, the heating elements 26 are in a fixed position at a distance from the protecting layers 10 of the pads 5, 6. In this case, thermal coupling is obtained through the probe-electrodes 25.

The structure described with reference to any one of the embodiments presented, with pads covered with protecting layers made of low-melting-temperature conductive material and provided in recesses delimited by a delimiting structure, may be used also to increase efficiency in the processes of production of so-called 3D integrated devices. Devices of this sort include a plurality of semiconductor dice or chips, each of which incorporates a respective portion of a device. Dice or chips are stacked and bonded on top of one another to form 3D devices or integrated circuits (3D ICs). The dice are provided with through vias in the substrate that enable coupling, as may be required, of portions of devices formed in distinct dice and placed in such a way as to create a stack. To provide the couplings, terminals of through vias of one of the dice are bonded to corresponding pads of an adjacent die.

According to one of the procedures most widely used, metal couplings are created (the so-called "metal-to-metal bonding"), for example using copper with processes of thermal-compression or ultrasound bonding.

Bonding may moreover be carried out at a wafer level ("wafer-to-wafer bonding"), at a die level ("die-to-die bonding"), or else, in a hybrid way, dice can be bonded on wafers ("die-to-wafer bonding").

Especially as regards wafer-to-wafer bonding, the alignment of the components is problematical and may prove imperfect. It may thus happen that devices already tested and operating properly give rise to complete or even partial 3D devices that are defective. In other cases, one of the devices may be affected by imperfections that are not detected during the individual test, but that emerge in subsequent tests on the partial stack or on the final device.

The bonding process is, however, typically irreversible, and hence the entire defective stack must be eliminated, with considerable detriment in terms of yield.

The structure described previously, instead, enables bonding to be rendered reversible. A stack may hence be repaired and, possibly, at least one of the devices that form the stack that has been recognized as defective may be eliminated and replaced by another device.

Figure 17:
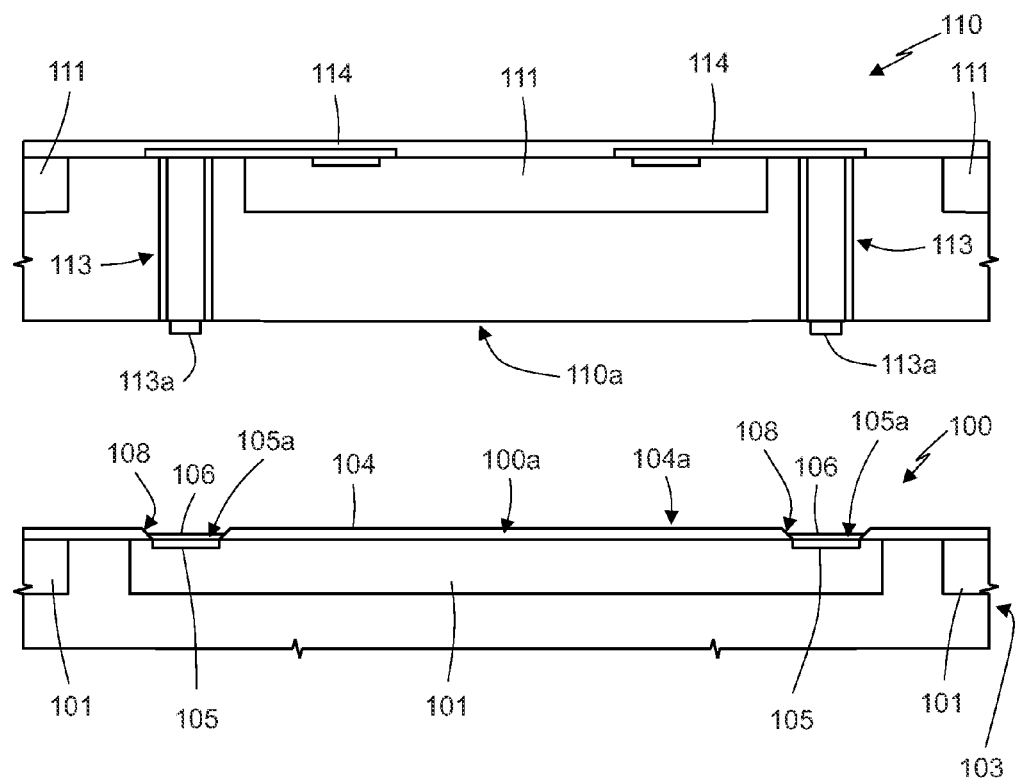
FIG. 17 shows a cross section through a semiconductor structure in accordance with a further embodiment, not assembled.

With reference to FIG. 17, a first semiconductor wafer 100, having a main surface 100a, includes a plurality of first integrated devices 101, formed in a structural portion 103 and adjacent to a face 100a of the first wafer 100. The structural portion 103 of the first wafer 100 is covered with a dielectric layer 104.

The first integrated devices 101 are provided with a plurality of pads 105, arranged in areas where the dielectric layer 104 presents openings. The pads 105 are made of metal, for example aluminium, copper, gold, platinum, nickel, or palladium, or else can be formed by multilayers of two or more distinct metals, for example taken from among the ones listed above, or by alloys.

The pads 105 are covered with respective protecting layers 106 made of low-melting-temperature conductive material.

The pads 105 are depressed with respect to a surface 104a of the dielectric layer 104 intended for coupling with a further semiconductor wafer or a semiconductor die or chip to create a stack. In addition, the protecting layers 106 are entirely contained in respective cup-shaped recesses 108 defined laterally by the dielectric layer 104 and on the bottom by surfaces 105a of the pad 105, which together form delimiting structures.

The material that forms the protecting layers 106 has a melting temperature lower than the material that forms the pads 105. For example, the melting temperature of the material forming the protecting layers 106 is lower than approximately 400° C., for example, lower than approximately 300° C. The protecting layers 106 can be made, for example, of a bonding alloy (of the type used for bonding components on PCBs) or a eutectic alloy, for example, but not limited thereto, chosen from among:

tantalum—gold, with approximately 28% of gold (melting temperature of approximately 131° C.);

tin—zinc, with approximately 9% of zinc (melting temperature of approximately 199° C.);

tin—gold, with approximately 10% of gold (melting temperature of approximately 217° C.);

gold—tin, with approximately 20% of tin (melting temperature of approximately 280° C.); or zinc—tin, with approximately 5% of tin (melting temperature of approximately 382° C.).

Alternatively, also non-eutectic alloys can be used, such as for example, but not limited thereto:

tin—silver, with approximately 4% of silver (melting temperature in a range approximately between 221° C. and 229° C.);

tin—copper, with approximately 0.7% of copper (melting temperature of approximately 227° C.); or zinc—tin, with approximately 30% of tin (melting temperature in a range approximately between 199° C. and 376° C.).

As a further alternative, non-alloy metals can be used, such as:

tin (melting temperature of approximately 232° C.);
indium (melting temperature of approximately 156° C.).

Of course, the percentages of the compositions of the various materials can be modified so as to change, for example, the melting temperature or their mechanical and/or electrical properties. For instance, compositions may be used, where the percentages of the materials vary up to approximately 30%, for example up to approximately 20% with respect to their eutectic composition, even though for specific requirements there is not ruled out the possibility of having greater variations.

Still referring to FIG. 17, a second semiconductor wafer 110 includes a plurality of second integrated devices 111 and a plurality of TSVs (Through Silicon Vias) 113, insulated from surrounding portions of the second wafer 110 and coupled to the second integrated devices 111 by metal conductive lines 114, for example made of aluminum or copper.

The through vias 113 traverse the second wafer 110 and have respective terminals 113a projecting from a face 110a of the second wafer 110 designed to be coupled to the first wafer 100. The projecting terminals 113a may be formed jointly with the through vias 113, or else subsequently as bumps or as metal multilayers. Furthermore, the through vias 113 are made in positions corresponding to respective pads 105 of the first wafer 100 so as to form contacts when the first wafer 100 and the second wafer 110 are aligned and joined by bonding.

Of course, also the second wafer 110 may have pads (here not shown) altogether similar to the pads 105 of the first wafer 100.

Here (but this applies also to the subsequent figures) through vias 113 are illustrated according to a "via-last" approach, but also other approaches for producing the through vias are possible (not illustrated herein), such as for example the "via-middle" approach, wherein the vias extend from an intermediate metallization layer (here not illustrated in detail) of the integrated device 111 towards the face 110a, the "via-first", wherein the vias are formed before creation of the metallization layers of the integrated device 111, and the "via-back", wherein the vias are provided on the back of the second wafer 110a starting from the face 110a and couple up to the integrated device 111.

Figure 18:
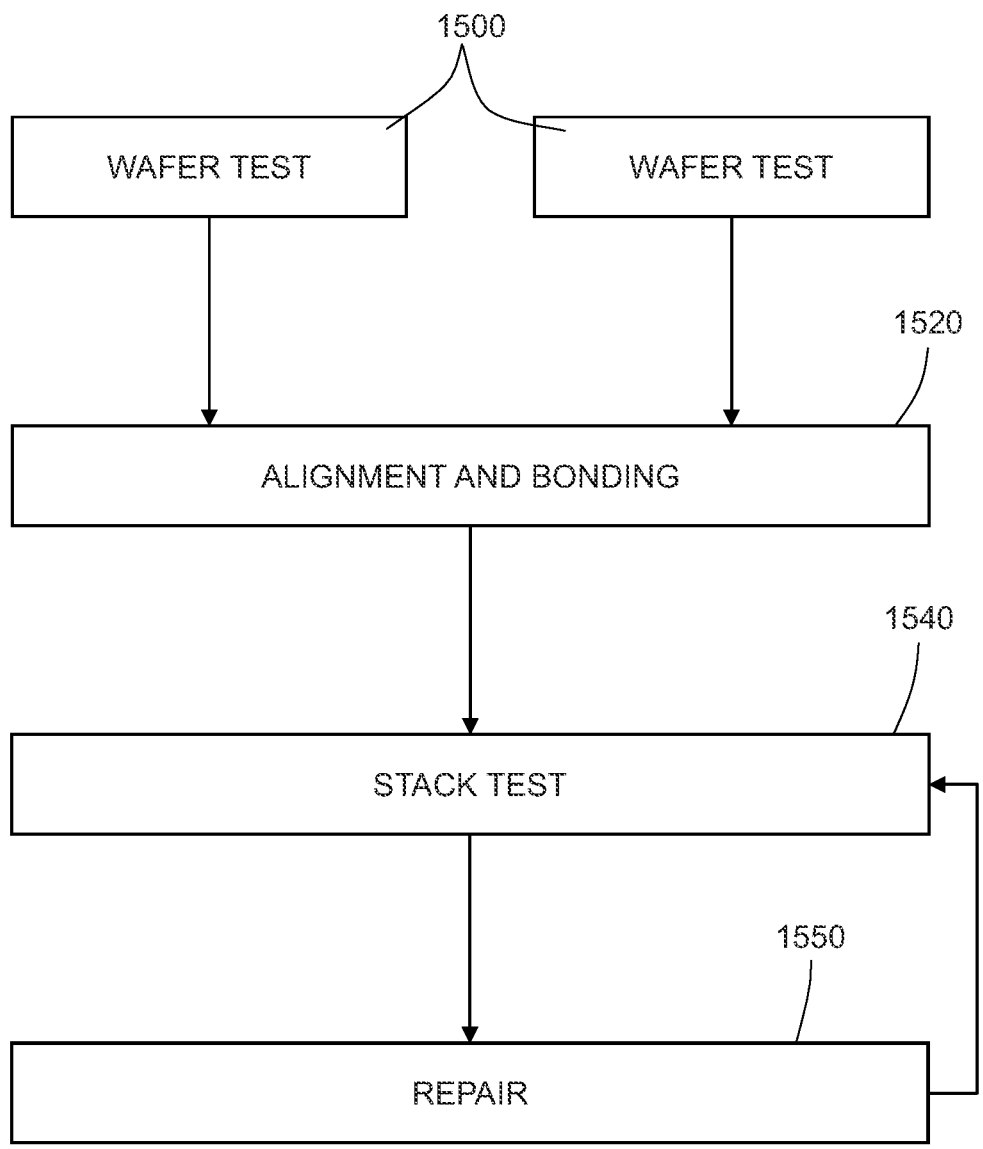
FIG. 18 is a simplified block diagram regarding a method in accordance with a further embodiment.

The first integrated devices 101 and the second integrated devices 111 are initially tested at wafer level (blocks 1500 in FIG. 18). After the terminals 113a have been exposed on the face 110a of the second wafer 110 (for example, by lapping of the second wafer 110 and subsequent chemical etching), the first wafer 100 and the second wafer 110 are then aligned in such a way that the terminals 113a of the through vias 113 of the second wafer 110 correspond to respective pads 105 of the first wafer 100.

Figure 19:
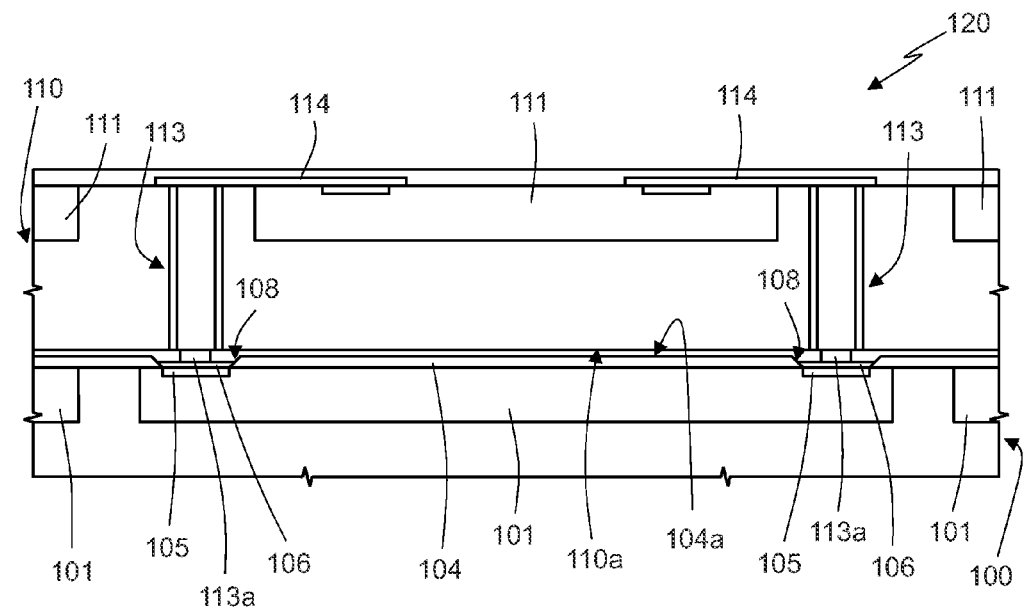
FIG. 19 shows a cross section through the semiconductor structure of FIG. 14, assembled, according to an embodiment.

This is followed by bonding (FIG. 19), thus obtaining a stack 120 including the first wafer 100 and the second wafer 110 (block 1520, FIG. 18). In this step, in particular, the terminals 113a of the through vias 113 are bonded to the protecting layers 106 of corresponding pads 105.

If, following upon a test at level of the stack 120 (block 1540), any malfunctioning is detected, that, for example, can be put down to the second integrated devices 111 of the second wafer 110, a repair procedure is performed (block 1550), whereby the second defective wafer 110 is replaced. The stack 120 is heated up until the material forming the protecting layers 106 melts. The first wafer 100 and the second wafer 110 can thus be separated from one another, and the defective wafer (in this case the second wafer 110) is replaced with a new one that functions properly.

The operation of replacement of the elements identified as faulty may be repeated even several times. On the one hand, in fact, heating the stack up to melting the protecting layers does not cause significant thermal stresses. On the other hand, the protecting layers can be restored by simply leaving the wafers to cool in approximately the horizontal position after separation. The material forming the protecting layers is in fact confined within the delimiting structures and is not dispersed. Once the material has solidified, the protecting layers resume their original conformation.

Of course, what has been said herein regarding the case of wafer-to-wafer bonding can be extended to the cases of die-to-die bonding and die-to-wafer bonding.

Figure 20:
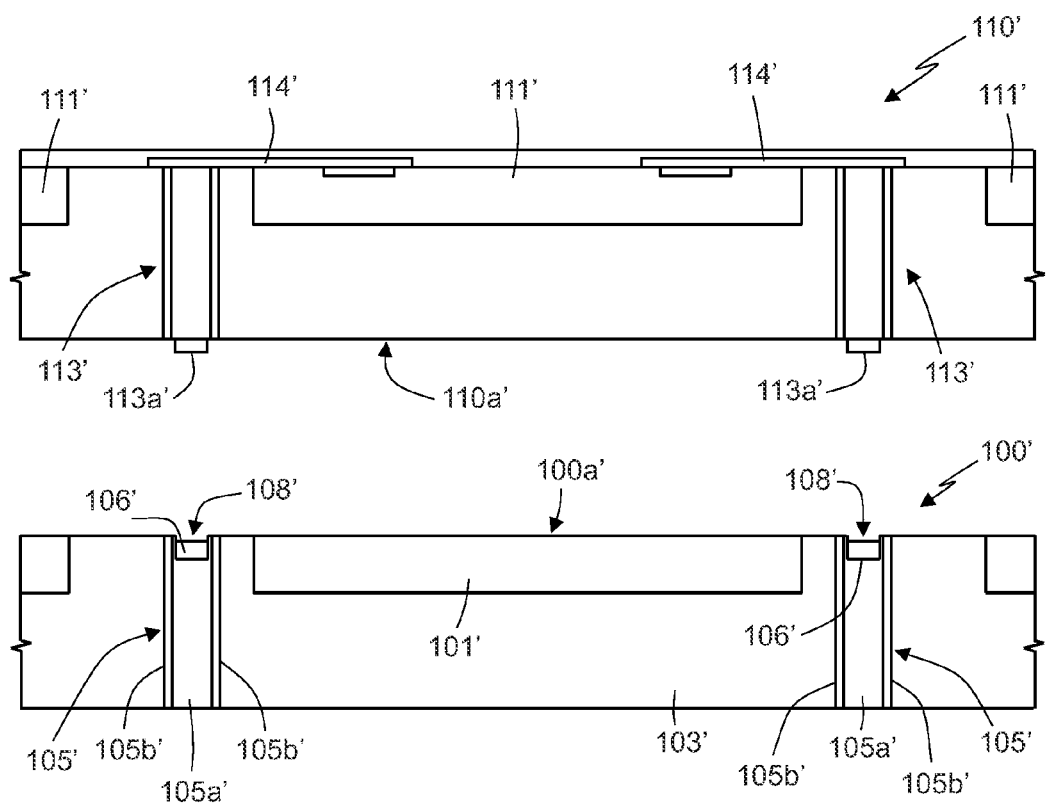
FIG. 20 shows a cross section through a semiconductor structure in accordance with a further embodiment, not assembled.

According to an embodiment (illustrated in FIG. 20), a first semiconductor wafer 100' having a main surface 100a' includes a plurality of first integrated devices 101' and first through vias 105'. The first through vias 105' include conductive plugs 105a' surrounded by hollow insulating regions 105b' (for example, cylindrical regions) and thus separated from a substrate 103' of the first wafer 100'. The conductive plugs 105a' can be made either of semiconductor material or metal. In the first case, the conductive plugs 105a' may be monocrystalline, for example formed by portions of the substrate 103' appropriately doped, or else polycrystalline, for example formed by opening a trench in the substrate 103' and subsequently filling it with deposited material. In the case of metal conductive plugs 105a', made by filling, materials such as for example aluminium, copper, tungsten, or nickel may be used.

Figure 21:
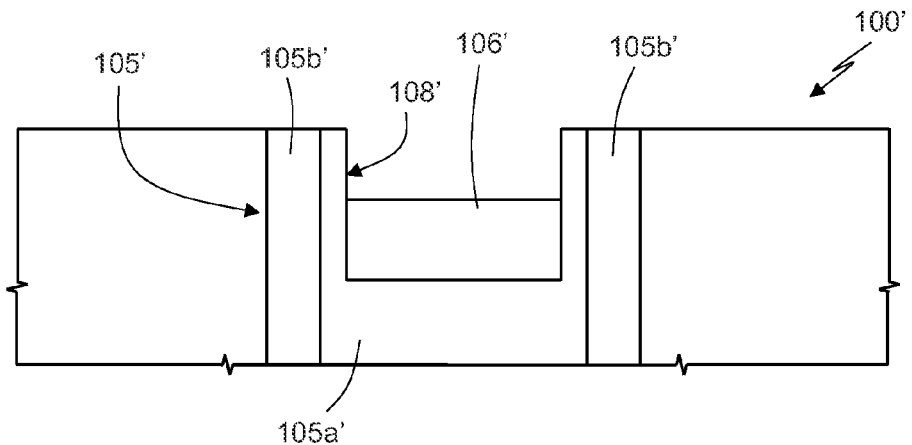
FIG. 21 shows an enlarged detail of the semiconductor structure of FIG. 16, according to an embodiment.
Figure 22:
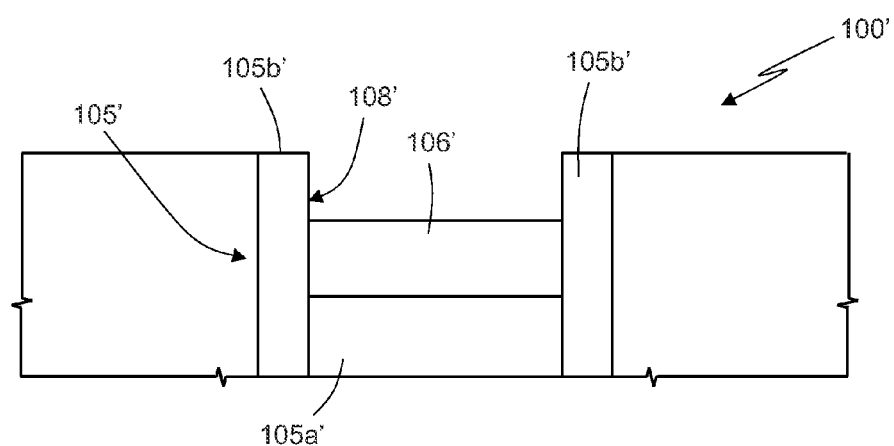
FIG. 22 shows a variant of the detail of FIG. 17, according to an embodiment.

A surface portion of the conductive plugs 105a' is opened to form recesses 108' in which coupling layers 106' are housed (FIG. 21). The conductive plugs 105a' (in a variant together with portions of the insulating regions 105b', FIG. 22) form delimiting structures for the coupling layers 106'.

The coupling layers 106' are made of a material having a melting temperature lower than that of the delimiting structure defined by the dug portion of the conductive plugs 105a' (and possibly by portions of the insulating regions 105b'). In particular, any of the materials mentioned above may be used.

A second wafer 110' includes second integrated devices 111' and a plurality of second through vias 113', which traverse the wafer 110' and have respective terminals 113a' projecting from a face 110a' of the second wafer 110' that is to be coupled to the first wafer 100'. The second through vias 113' are made in positions corresponding to respective first through vias 105' of the first wafer 100', and are coupled to the second integrated devices 111' by metal conductive lines 114', for example made of aluminium, copper, tungsten, or nickel.

Of course, even though it is not illustrated, also the first through vias 105' of the first wafer 100' may be coupled to the first integrated devices 101' by conductive lines similar to the conductive lines 114' of the second wafer 110'.

The first wafer 100' may have through vias 105' with terminals (not illustrated) similar to the terminals 113a' of the second wafer 110'.

The first integrated devices 101' and the second integrated devices 111' are initially tested at wafer level. In this step, also the first through vias 105' and the second through vias 113' may be tested using probe-electrodes.

After testing, a thermal process may be performed, as already described, which allows to restore the original configuration of all the coupling pads possibly present (not shown) and, moreover, also of the coupling layers 106' of the second through vias 113'.

The first wafer 100' and the second wafer 110' are then aligned in such a way that the terminals 113a' of the through vias 113' of the second wafer 110' correspond to respective first through vias 105' of the first wafer 100'.

Figure 23:
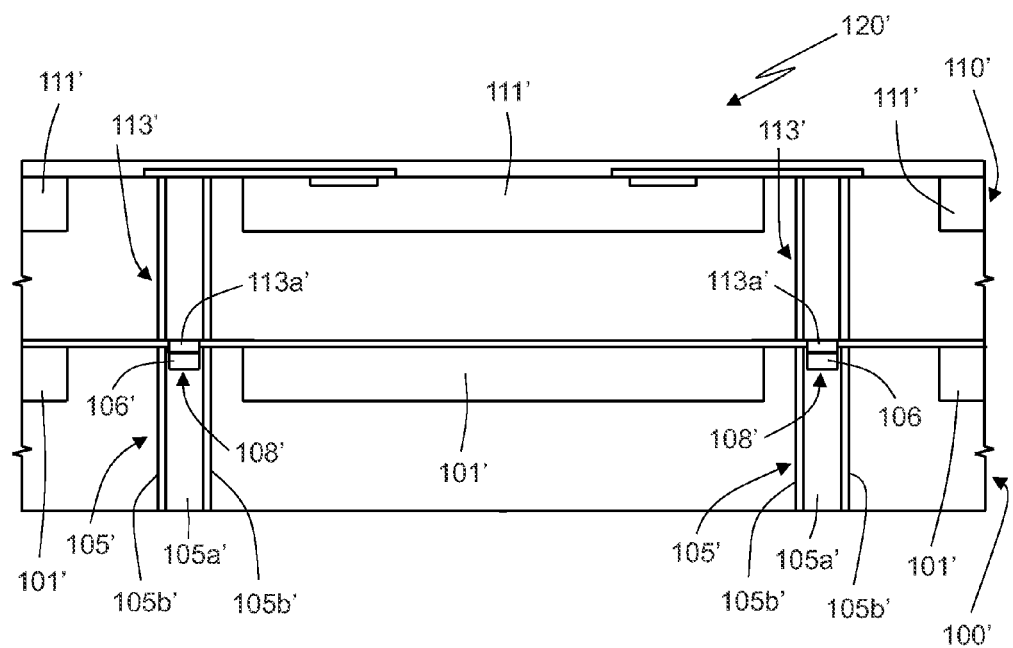
FIG. 23 shows a cross section through the semiconductor structure of FIG. 16, assembled, according to an embodiment.

When the first wafer 100' and the second wafer 110' are bonded to form a stack 120' (FIG. 23), terminals 113a' of second through vias 113' of the second wafer 110' are bonded to the coupling layers 106' of corresponding first through vias 105' of the first wafer 100'. Bonding is reversible, as already described, because the stack 120' can be easily heated up to cause melting of the material forming the coupling layers 106' to separate the wafers forming the stack 120' itself.

Modifications and variations may be made to the semiconductor structures and to the repair method described, without thereby departing from the scope of the present disclosure.

In particular, it is clear that stacks can be envisaged including more than two semiconductor wafers, each of which can include both pads covered with protecting layers and through vias having conductive coupling layers as described.

Furthermore, repair can be performed not only at the wafer level (single or stack), but also at the level of individual dice.

Moreover, chips and chip stacks such as those described above may be part of a system, such as a computer system, in which an integrated circuit on a chip or chip stack is coupled to another integrated circuit on the same chip or chip stack (e.g., a system on a chip), or coupled to another integrated circuit on one or more different chips or chip stacks. And at least one of the integrated circuits in the system may be a computing circuit such as a microprocessor or microcontroller.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. A structure, comprising: a semiconductor first layer configured to be solid at a temperature; a region disposed adjacent to the semiconductor first layer and configured to be solid at the temperature; an exposed recess disposed in the region; and a coupling pad having a heating element, the coupling pad disposed in the exposed recess and including a first conductive portion configured to be molten at the temperature.

2. The structure of claim 1 wherein the semiconductor first layer includes a semiconductor substrate.

3. The structure of claim 1 wherein the region includes an insulator second layer disposed over the semiconductor first layer.

4. The structure of claim 1 wherein the region includes a second conductor disposed in the semiconductor first layer.

5. The structure of claim 1 wherein the region includes a conductive via disposed in the semiconductor first layer.

6. The structure of claim 1 wherein: the region includes an insulator second layer disposed over the semiconductor first layer; and the coupling pad includes a second conductive portion disposed in the exposed recess beneath and in contact with the first conductive portion and configured to be solid at the temperature.

7. The structure of claim 1 wherein the coupling pad includes a coupling test pad.

8. An integrated circuit, comprising: a semiconductor first layer configured to be solid at a temperature; a region disposed adjacent to the semiconductor first layer and configured to be solid at the temperature; a recess disposed in the region; and a coupling pad having a heating element, the coupling pad disposed in the recess and including a first conductor configured to be molten at the temperature.

9. The integrated circuit of claim 8 wherein:
the region includes an insulator second layer disposed over the semiconductor first layer, and
the coupling pad includes a second conductor disposed in the recess beneath, and in contact with, the first conductor, and configured to be solid at the temperature.

10. The integrated circuit of claim 8 wherein the region includes a conductive via disposed in the semiconductor first layer.

11. A system, comprising: a first integrated circuit, including a semiconductor first layer configured to be solid at a temperature, a region disposed adjacent to the semiconductor first layer and configured to be solid at the temperature, an exposed recess disposed in the region, and a coupling pad having a heating element, the coupling pad disposed in the exposed recess and including a first conductor configured to be molten at the temperature; and a second integrated circuit coupled to the first integrated circuit.

12. The integrated circuit of claim 11 wherein one of the first and second integrated circuits includes a computing circuit.

13. The integrated circuit of claim 11 wherein the first and second integrated circuits are disposed on a same die.

14. The integrated circuit of claim 11 wherein the first and second integrated circuits are disposed on respective dies.

15. The integrated circuit of claim 11 wherein the second integrated circuit is disposed over the first integrated circuit and includes a conductive terminal that is in contact with the coupling pad of the first integrated circuit.

16. The integrated circuit of claim 11 wherein the second integrated circuit is stacked over the first integrated circuit and includes a conductive terminal that is disposed in the recess, and in contact with the coupling pad, of the first integrated circuit.

17. A method, comprising: contacting a coupling pad of a semiconductor structure with a member, the coupling pad including a heating element; and melting a portion of the coupling pad without melting any other portion of the semiconductor structure.

18. The method of claim 17 wherein the portion of the coupling pad includes a top portion of the coupling pad.

19. The method of claim 17 wherein melting the portion of the coupling pad includes melting the portion without melting the member.

20. A method, comprising:
contacting a coupling pad of a semiconductor structure with a member; and
melting a portion of the coupling pad without melting any other portion of the semiconductor structure;
the member includes a probe tip;
contacting the coupling pad includes deforming the coupling pad with the probe tip; and
melting the portion of the coupling pad includes removing a deformation from the coupling pad.

21. The method of claim 17, further comprising:
wherein the semiconductor structure includes a first wafer;
wherein contacting the coupling pad includes attaching a terminal of a second wafer to the coupling pad; and
detaching the terminal of the second wafer from the coupling pad of the first wafer while the portion of the coupling pad is molten.

22. The method of claim 17, further comprising:
wherein the semiconductor structure includes a first wafer;
wherein contacting the coupling pad includes attaching a second wafer to the first wafer by attaching a terminal of the second wafer to the coupling pad; and
detaching the second wafer from the first wafer by detaching the terminal of the second wafer from the coupling pad of the first wafer while the portion of the coupling pad is molten.

23. The method of claim 17, further comprising:
wherein the semiconductor structure includes a first wafer;
wherein contacting the coupling pad includes attaching a second wafer to the first wafer by attaching a terminal of the second wafer to the coupling pad;
detaching the second wafer from the first wafer by detaching the terminal of the second wafer from the coupling pad of the first wafer while the portion of the coupling pad is molten;
allowing the portion of the coupling pad to solidify;
cleaning the coupling pad;
melting the portion of the cleaned coupling pad; and
attaching a third wafer to the first wafer by attaching a terminal of the second wafer to the coupling pad while the portion of the coupling pad is molten.

24. The method of claim 17, further comprising cleaning the coupling pad before melting the portion of the coupling pad.

25. A method, comprising:
contacting a coupling pad of a semiconductor structure with a member; and
melting a portion of the coupling pad without melting any other portion of the semiconductor structure;
wherein the semiconductor structure includes a first die;
wherein contacting the coupling pad includes attaching a terminal of a second die to the coupling pad; and
detaching the terminal of the second die from the coupling pad of the first die while the portion of the coupling pad is molten.

\* \* \* \* \*